(12) United States Patent
Gao (10) Patent No.: US 11,792,955 B2
(45) Date of Patent: *Oct. 17, 2023

(54) THERMAL TRANSFER SYSTEM AND CONTROL IN MULTIPLE OPERATING CONDITIONS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 648 days.

This patent is subject to a terminal disclaimer.

(21) Appl. No.: 16/849,649

(22) Filed: Apr. 15, 2020

(65) Prior Publication Data

US 2021/0329814 A1 Oct. 21, 2021

(51) Int. Cl.
| F28F 27/00 | (2006.01) |
| H05K 7/20 | (2006.01) |
| G05B 15/02 | (2006.01) |
| G05D 23/19 | (2006.01) |
| G06F 1/20 | (2006.01) |

(52) U.S. Cl.
CPC ......... H05K 7/20281 (2013.01); G05B 15/02 (2013.01); G05D 23/1904 (2013.01); G05D 23/1931 (2013.01); G06F 1/206 (2013.01); H05K 7/20172 (2013.01); H05K 7/20263 (2013.01); H05K 7/20272 (2013.01); G06F 2200/201 (2013.01)

(58) Field of Classification Search
CPC .... F28F 3/02; F28F 3/12; F24H 1/121; H05K 7/20; H01L 23/4735; H05B 3/20; F25B 29/00

See application file for complete search history.

(56) References Cited

U.S. PATENT DOCUMENTS 8,151,872 B2 * 4/2012 Di Stefano ........ G05D 23/1931
165/80.4

* cited by examiner

*Primary Examiner* — Davis D Hwu
(74) *Attorney, Agent, or Firm* — WOMBLE BOND DICKINSON (US) LLP (57) ABSTRACT

Embodiments are disclosed of an apparatus including a cooling loop and a heating loop. A temperature control plate adapted to be thermally coupled to one or more heat-generating electronic components. The temperature control plate has a fluid inlet fluidly coupled to an inlet control, and a fluid outlet fluidly coupled to an outlet control. Both the cooling loop and the heating loop are fluidly coupled to the temperature control plate. Temperature sensors and a controller are coupled to the system. Based on initial temperature measurements, the controller determines whether the electronic components require a cooling-only temperature control strategy or require a hybrid temperature control strategy that includes heating, cooling, and a transition between heating and cooling. The controller then implements the selected strategy.

20 Claims, 11 Drawing Sheets

THERMAL TRANSFER SYSTEM AND CONTROL IN MULTIPLE OPERATING CONDITIONS

TECHNICAL FIELD

The disclosed embodiments relate generally to systems for temperature control of electronic equipment and in particular, but not exclusively, to a system for temperature control in multiple operating conditions.

BACKGROUND

Much modern electronic equipment operates in predictable and steady temperature conditions. In data centers, for instance, the ambient temperature is very tightly controlled so that all the servers, routers, edge computing servers, etc., within the data center operate in steady, known temperature conditions. In homes the temperature is less tightly controlled but typically does not vary widely, so that even home electronics operate within a larger but still tolerable temperature range. In both these environments, the ambient temperature is such that electronic equipment usually needs only cooling, not heating.

But there are applications in which electronic equipment operates in uncontrolled temperature conditions where the temperature can vary widely. Electronics that operate outdoors are an example. Depending on the location and season, they can be forced to operate in ambient temperatures ranging from below freezing to very hot. Because electronics can have trouble starting up in very cold conditions and operating in very hot conditions, these applications can require both heating and cooling. Previous temperature control systems have typically provided heating or cooling, but not both. Some systems exist that use an electrical heater in a cooling loop, but these systems might not be applicable for some kinds of electronics and, moreover, these systems are not easy to control and have relatively low efficiency, costly and requires large space.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of systems for temperature control of electronic components. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments are of a heat transfer system for electronics. The system includes two loops—one for cooling and one for heating. When heating is needed the heating loop is used as a bypass loop of the cooling loop. Embodiments of control processes for the disclose systems are also described. The disclosed embodiments enable proper thermal management and working environment for the processors or electronics running under different temperatures, seasons, and locations.

Figure 1A:
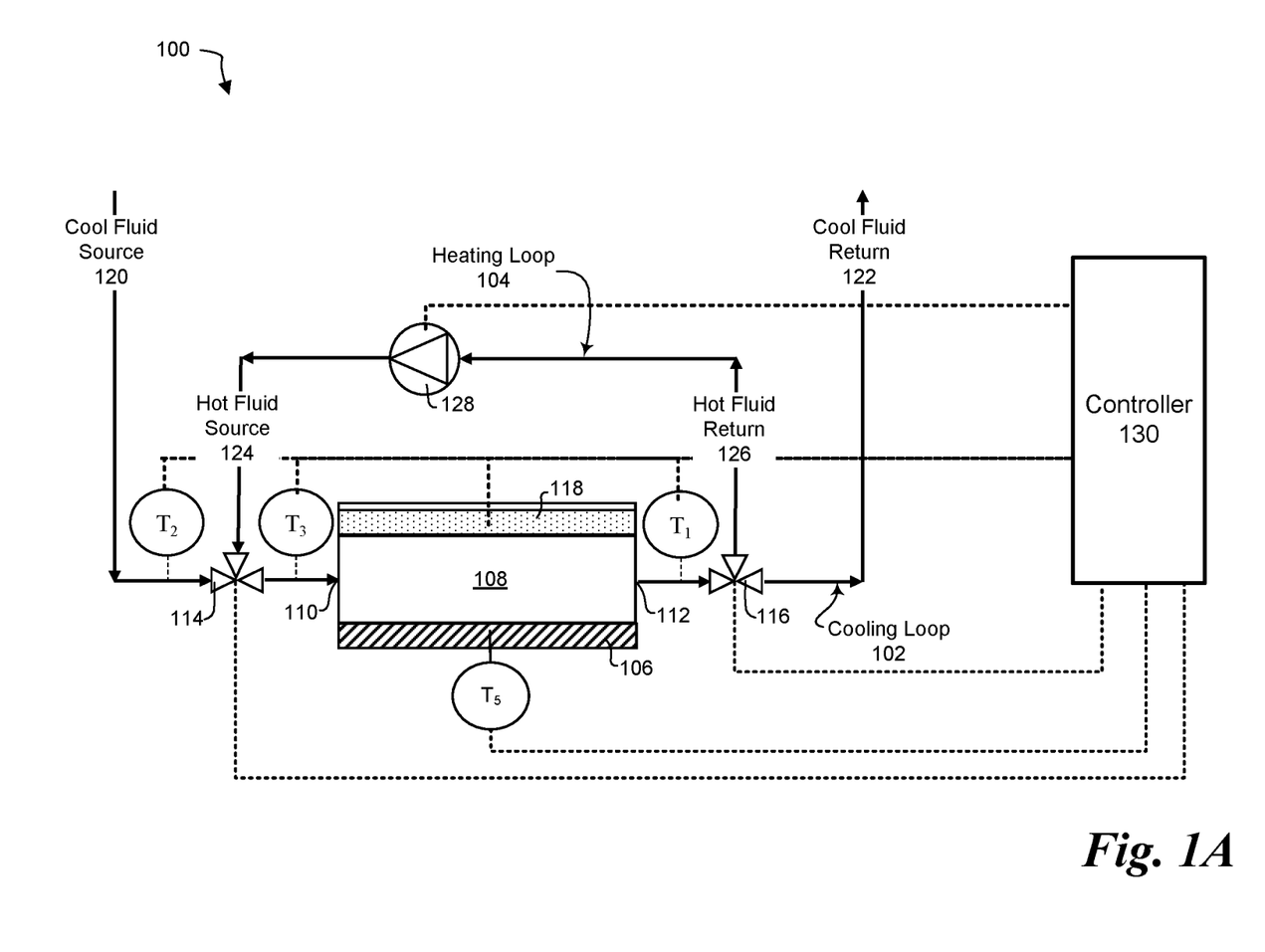
FIGS. 1A-1B are schematics of embodiments of temperature control systems with open-loop cooling.

FIG. 1A illustrates an embodiment of a temperature control system 100. System 100 includes a cooling loop 102 and a heating loop 104, both of which are fluidly coupled to a temperature control plate 108 so that they can be used to control the temperature of one more heat-generating electronics components 106. In various modes of operation, cooling loop 102 can operate alone, heating loop 104 can operate alone, or cooling loop 102 and heating loop 104 can operate simultaneously to control the temperatures of fluid in the loop and electronic components 106 by heating, cooling, or a combination of the two.

A temperature control plate 108 is thermally coupled to electronic components 106, so that heat can be exchanged between the electronic components and a working fluid flowing through the temperature control plate. The heat exchange can be in either direction—from electronic components 106 into the working fluid, or from the working fluid into the electronic components—depending on whether system 100 is cooling or heating electronic components 106. Temperature control plate 108 includes a fluid inlet 110 and a fluid outlet 112. An inlet control 114 is fluidly coupled to fluid inlet 110 and an outlet control 116 is fluidly coupled to outlet 112. As used herein, two elements are "fluidly coupled" if they are coupled to each other, directly or indirectly, in such a way that a fluid can flow between them in one or both directions. In the illustrated embodiment inlet control 114 and outlet control 116 are both three-way valves, but in other embodiments they can be other types of controls. For instance, in other embodiments inlet control 114 and outlet control 116 can be combinations of two-way valves. In still other embodiments, inlet control 114 and outlet control 116 need not be the same kind of control. In most scenarios, inlet control 114 and outlet control 116 are at the same opening status. Still further embodiments can omit one of the two controls 114 and 116.

Cooling loop 102 is an open loop fluidly coupled to temperature control plate 108. A cool fluid source 120 is fluidly coupled to inlet control 114 and a cool fluid return 122 is fluidly coupled to outlet control 116, so that the inlet and outlet controls regulate the flow of working fluid from the cooling loop through temperature control plate 108.

Heating loop 104 is similarly coupled to temperature control plate 108 through inlet control 114 and outlet control 116, so that the inlet and outlet controls also regulate the flow of working fluid from the heating loop through temperature control plate 108. A heating fluid source 124 is fluidly coupled to inlet control 114 and a heating fluid return 126 is fluidly coupled to outlet control 116. Heating fluid source 124 is a source of hot working fluid for the temperature control plate, while heating fluid return 126 returns hot working fluid exiting the temperature control plate. A pump 128 is fluidly coupled into heating loop 104 to circulate the working fluid through this loop. Temperature control plate 108 includes a heater 118 to heat working fluid flowing through the temperature control plate. Heating loop 104, then, uses heater 118, as well as heat generated by electronic components 106 themselves, to heat the working fluid flowing through the heating loop. By selectively configuring inlet control 114 and outlet control 116, cool working fluid, hot working fluid, or a mixture of the two, can be directed through temperature control plate 108. Heating loop 104 and cooling loop 102 are therefore not completely separate, but rather are fluidly coupled to each other via inlet control 114, outlet control 116, and temperature control plate 108. Put differently, in system 100 temperature control plate 108 is part of both the heating loop and the cooling loop. As a result of their shared coupling to temperature control plate 108, the cooling loop and heating loop circulate the same working fluid.

Heating loop 104 is substantially shorter than cooling loop 102 so that it can quickly heat electronic components 106 when needed. Designing the heating loop as a short bypass loop allows working fluid in the loop to heat quickly since the heat that can be generated and introduced to the loop is limited to a certain period of time. By using heat generated by the electronics 106 as much as possible, the working fluid in the loop can also be heated much more quickly. Because the heating loop is a much shorter loop compared to the cooling loop there is less working fluid in the heating loop and the fluid within the heating loop can be heated up faster given the limited amount of heat provided.

Temperature sensors can be positioned in various places in system 100 to allow the system's performance to be monitored. The illustrated embodiment includes four temperature sensors T1-T3 and T5:

T1 is positioned downstream of outlet 112 to measure the temperature of working fluid exiting temperature control plate 108. In the illustrated embodiment sensor T1 is positioned between outlet 112 and outlet control 116, but in other embodiments T1 could be positioned differently, for instance downstream of outlet control 116 in cool fluid return 122 or heating fluid return 126.

T2 is positioned in cool fluid source 120 upstream of inlet control 114 to measure the temperature of the cool working fluid.

T3 is positioned just upstream of inlet 110 to measure the temperature of working fluid entering temperature control plate 108.

T5 is positioned in, on, or near electronic components 106 to measure their temperature. T5 can also be one or more sensors packed inside the components, for example, the junction temperature of an ASIC.

Other embodiments of system 100 can have more or less temperature sensors than shown. When heating loop 104 is not operating, or if inlet control 114 and outlet control 116 are set to stop flow through heating loop 104, then temperatures T2 and T3 will be the same or close to the same. But when heating loop 104 is operating exclusively (i.e., inlet control 114 and outlet control 116 are set to only allow flow from heating loop 104 into temperature control plate 108), or when cooling loop 102 and heating loop 104 are operating simultaneously (i.e., inlet control 114 and outlet control 116 are set to allow flow from both cooling loop 102 and heating loop 104 into temperature control plate 108), T3 will generally be greater than T2.

A controller 130 is coupled to various elements to control operation of system 100. In one embodiment, controller 130 can be a general-purpose computer including a processor, memory, storage, a communication interface, and other such components, but in other embodiments it can be a special-purpose circuit such as an application-specific integrated circuit (ASIC). Controller 130 is communicatively coupled to temperature sensors T1-T3 and T5 so that it can receive temperature information from the temperature sensor locations. Controller 130 is also communicatively coupled to inlet control 114 and outlet control 116, to heater 118, and to pump 128. Controller 130 has instructions stored thereon that, when executed by the controller, allow the controller to monitor the measured temperatures and to control the other components to which it is communicatively coupled, so that it controls operation of system 100.

In operation, system 100 can operate in at least three modes: cooling mode, heating mode, and mixed mode:

Mode 1: cooling mode, cooling loop is recirculating for cooling; and fluid in the heating loop stays still.

Mode 2: heating mode, only heating loop is recirculating for heating, the heat can be from either heater 118, electronic components 106 or both;

Mode 3: mixed mode this is a transition mode, in mixing mode, the purpose is to use the heat generated in the heating loop to slightly heat up the cooling loop and adjust the cooling loop to a proper temperature, the heat source is mainly from 106. The design aims to save power, so heater 118 is turned off during transition mode. Another purpose is to eliminate the impact of cooling fluid when they're at relative low temperatures. This can be also understood as controlling $T_2$ to proper operating conditions all the time.

Cooling mode can be implemented by the cooling loop operating alone, or by the cooling loop and heating loop operating together but with heater 118 turned off. Heating mode is invoked, for instance, in situations where electronics 106 must be started in very cold conditions. In heating mode, the inlet and outlet controls are set to form a closed heating loop, meaning that no working fluid circulates in cooling loop 102. Once the fluid in the heating loop is heated to certain temperature, the inlet and outlet controls can be adjusted to mixed mode, where it mixes working fluid from heating loop and cooling loop. In this mode, the system is operated to ensure proper thermal conditions of the electronic components as well as to adjust to an optimal operating condition. When both loops are working, the system can be adjusted and controlled to an optimal heat transfer equilibrium of the system. Whether in heating mode or mixed mode, heating can be implemented various ways. The working fluid can be heated by electronic components 106 only, by heater 118 only, or by a combination of electronic components 106 and heater 118. The ideal design is to use the heater as less as possible. The main purpose of the heat is to heat the fluid when it is at very low temperature and the electronic components are not powered up.

Figure 1B:
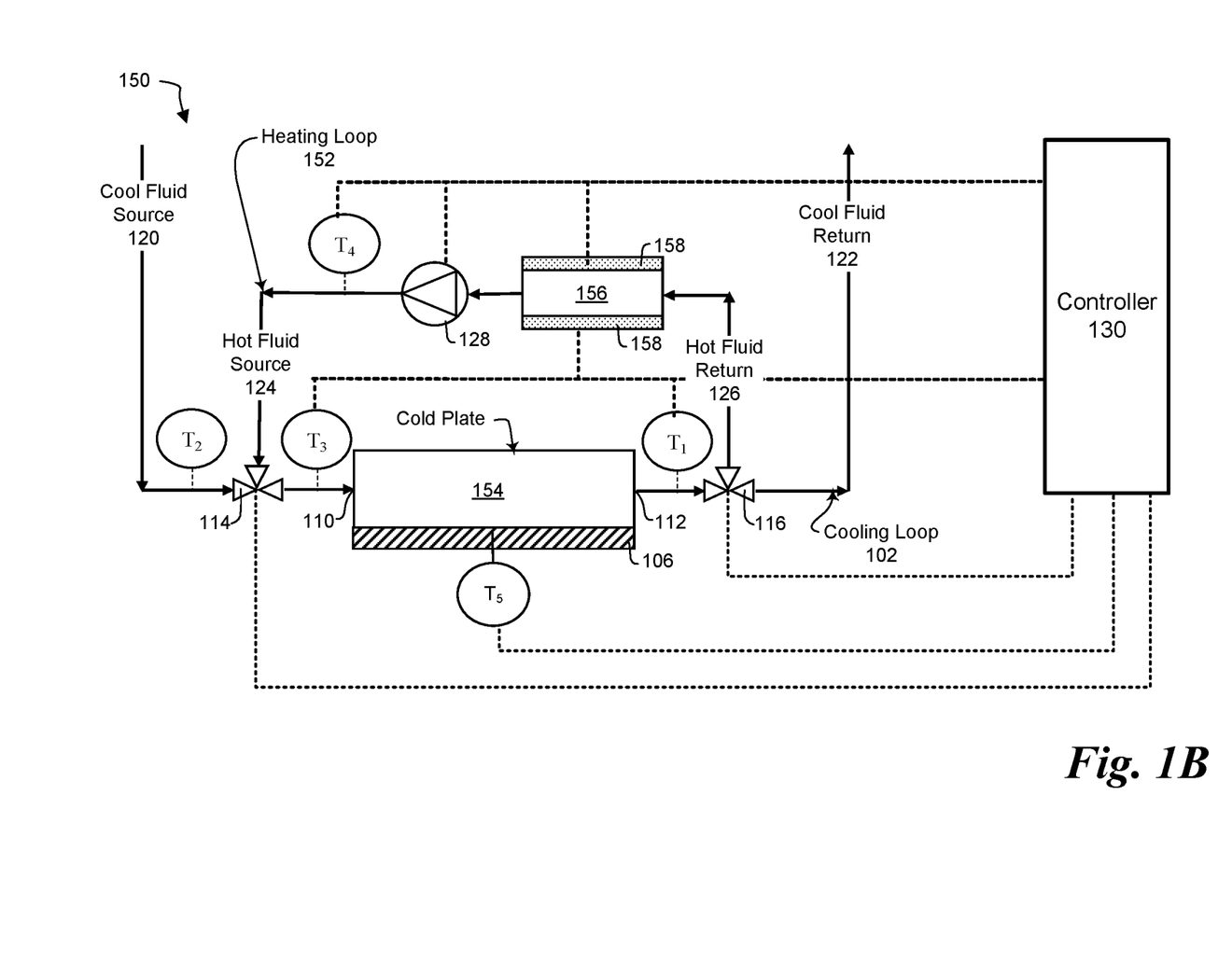

FIG. 1B illustrates an embodiment of a temperature control system 150. System 150 is in most respects similar to system 100. The primary difference between systems 150 and 100 is in where the working fluid is heated in the heating loop.

System 150 includes a cold plate 154 thermally coupled to heat-generating electronics 106. Cold plate 154 is in most respects similar to temperature control plate 108: it includes a fluid inlet 110 and a fluid outlet 112, with an inlet control 114 fluidly coupled to fluid inlet 110 and an outlet control 116 fluidly coupled to outlet 112. Cold plate 154 allows heat provided by the heat-generating electronic components 106 themselves to heat the working fluid flowing through the cold plate. But unlike temperature control plate 108, cold plate 154 includes no separate internal heater to heat the working fluid.

Cooling loop 102 is substantially the same in system 150 as it is in system 100: it is an open loop fluidly coupled to cold plate 154. A cool fluid source 120 is fluidly coupled to inlet control 114 and a cool fluid return 122 is fluidly coupled to outlet control 116, so that the inlet and outlet controls regulate the flow of cool working fluid through cold plate 154.

Figure 2A:
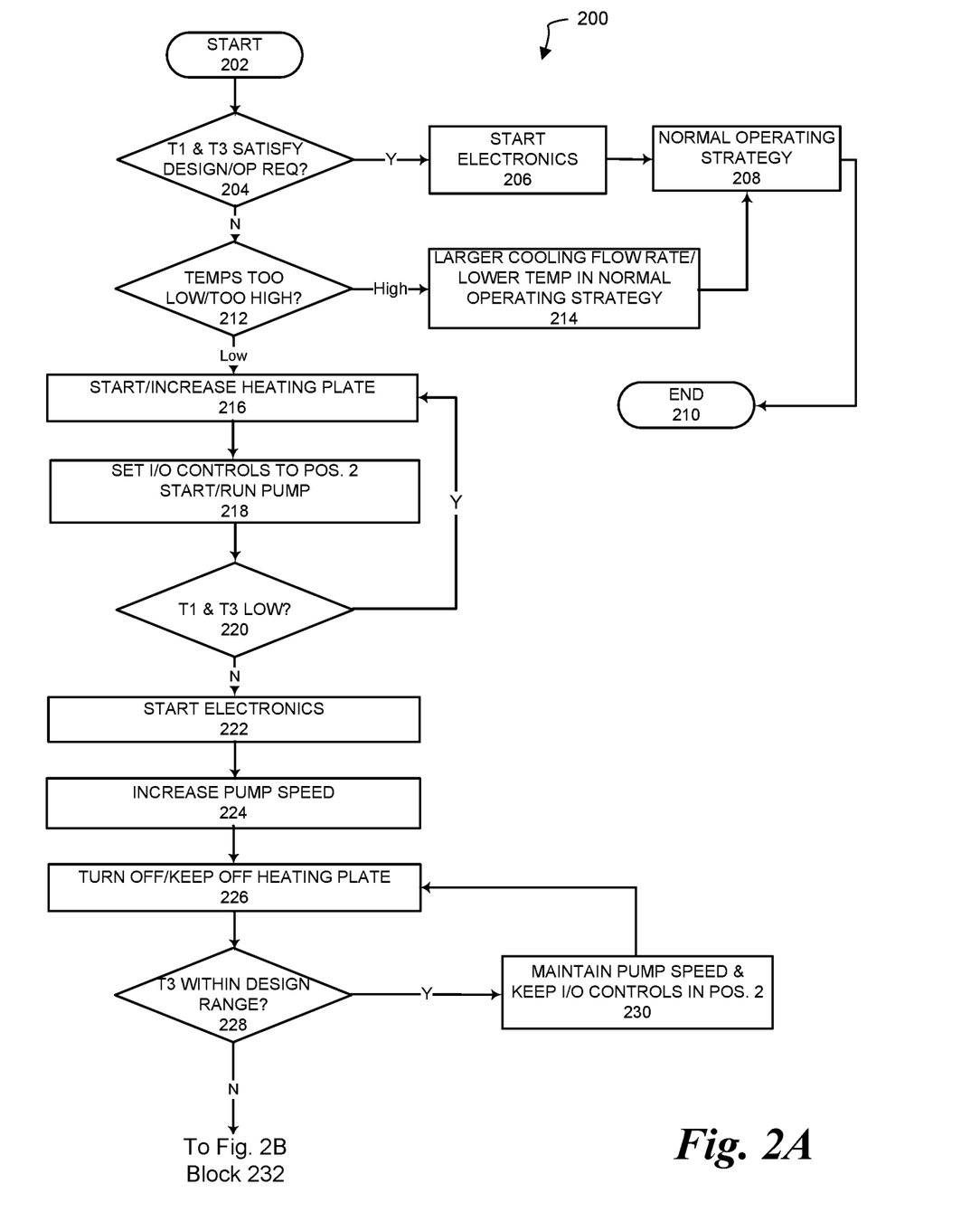
FIGS. 2A-2B together are a flowchart of an embodiment of a process for operating the temperature control system of FIG. 1B.
Figure 2B:
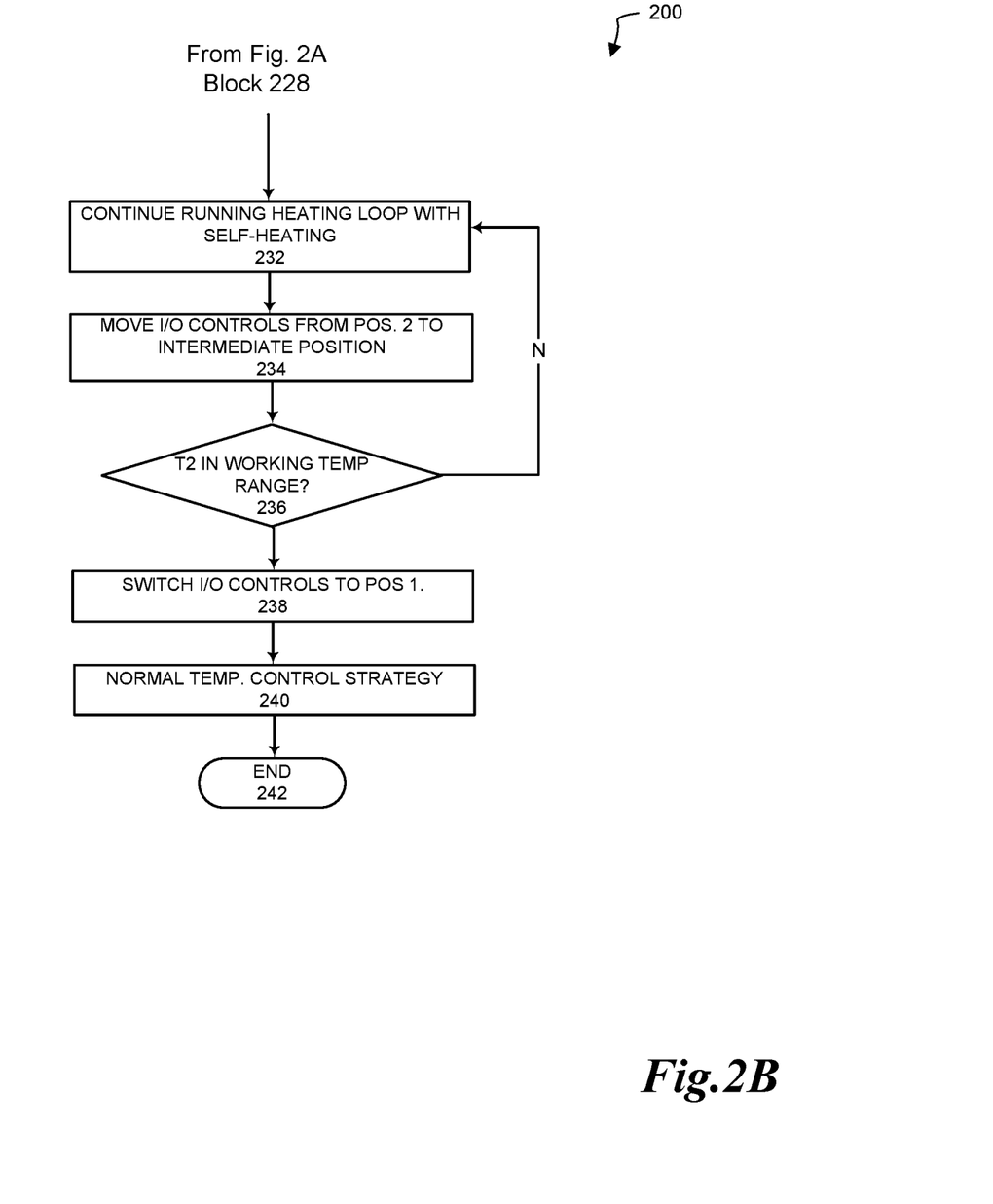

Heating loop 152 is different from heating loop 104. As in heating loop 104, a heating fluid source 124 is fluidly coupled to inlet control 114, a heating fluid return 126 is fluidly coupled to outlet control 116, and a pump 128 is fluidly coupled into heating loop 104 to circulate the working fluid through this loop. Unlike heating loop 104, heating loop 152 includes a heating plate 156, separate from cold plate 154 and positioned elsewhere in the heating loop, to heat the working fluid flowing through this loop. Heating plate 156 includes one or more heaters 158 to heat the working fluid. An embodiment of a heating plate is shown in FIGS. 2A-2B and described below.

To allow the system's performance to be monitored, system 150 includes the same temperature sensors T1-T5. Temperature sensors T1-T3 and T5 are in the same locations as in system 100, but because most of the heating now happens at heating plate 156 instead of at cold plate 154, system 150 includes an additional temperature sensor T4 downstream of the heating plate to monitor the temperature of fluid exiting the heating plate. In the illustrated embodiment temperature sensor T4 is downstream of pump 128, but in other embodiments it can be positioned at the outlet of the heating plate.

Controller 130 is coupled to several elements to control operation of system 150. In one embodiment, controller 130 can be a general-purpose computer including a processor, memory, storage, a communication interface, and other such components, but in other embodiments it can be a special-purpose circuit such as an application-specific integrated circuit. Controller 130 is communicatively coupled to temperature sensors T1-T5 so that it can receive temperature information from the temperature locations to monitor the conditions within system 100. Controller 130 is also communicatively coupled to inlet control 114 and outlet control 116, to heaters 158, and to pump 128. Controller 130 has instructions stored thereon that, when executed by the controller, allow the controller to monitor the measured temperatures and to control the other components to which it is communicatively coupled, so that it controls the operation of system 150.

Despite their differences, systems 150 and 100 operate similarly and have the same modes of operation. By selectively configuring inlet control 114 and outlet control 116, cool working fluid, hot working fluid, or a mixture of the two, can be directed through cold plate 154 to regulate the temperature of electronics 106. An embodiment of a process by which controller 130 can control system 150 is described below in connection with FIGS. 2A-2B.

FIGS. 2A-2B together illustrate an embodiment of a process 200 for operating temperature control system with open-loop cooling. Although described with reference to system 150, process 200 can be extended to other embodiments, such as system 100 (see FIG. 1A). To reduce clutter, the flowchart and its description use the following terminology:

Inlet control 114 and outlet control 116 are referred to—individually or collectively, as the context requires—as I/O controls.

Inlet control 114 has positions 1 and 2, as well as one or more intermediate positions between positions 1 and 2. Position 1 allows flow only through the cooling loop, position 2 allows flow only through the heating loop, and intermediate positions allows flow through both the cooling loop and heating loop. The exact intermediate position regulates how much working fluid flows through each loop.

Outlet control 116 similarly has positions 1 and 2, as well as one or more intermediate positions between positions 1 and 2. Position 1 allows flow only through the cooling loop, position 2 allows flow only through the heating loop, and intermediate positions allows flow through both the cooling loop and heating loop. The exact intermediate position regulates how much working fluid flows through each loop.

Electronics refers to one or more electronic components 106.

Self-heating refers to a condition in which working fluid in the heating or cooling loop is heated only by the electronic components 106 themselves.

T1-T3 and T5 are used to refer to temperature sensors T1-T3 and T5, or to the temperatures measured by those sensors, as the context requires.

The process begins at block 202. At blocks 204-212 the process determines whether the system can operate according to its normal operating strategy and, if it can, adjusting it to operate according to that strategy. In most scenarios, cooling is the normal operating strategy. At block 204 the process checks whether temperatures T1 and T3 satisfy the operation and design requirements. If at block 204 both T1 and T3 satisfy design and operation requirements, meaning that no heating is required, the process moves to block 206 where it starts electronics, and then proceeds to block 208, where it invokes the normal operating strategy for maintaining the electronics at the desired temperature. The process then moves to block 210, where it ends. But if at block 204 T1 and T3 do not satisfy design and operation requirements, the process moves to block 212 where determines whether T1 and T3 are too high or too low. If at block 212 the process determines that T1 and T3 are too high, the process proceeds to block 214 were it increases the cooling flow rate and/or attempts to lower the temperature in the normal operating strategy. The process then proceeds to block 208, where it continues with the normal operating strategy for controlling the temperature of system 150, then ends at block 210.

If at blocks 204-212 the process cannot use its normal operating strategy, blocks 216-240 implement a hybrid control strategy. If at block 212 the process determines that T1 and T3 are too low, meaning that the system is starting in cold temperatures lower than the design temperature, the process implements the hybrid control strategy, in which it first heats and then returns to its normal operating strategy when conditions are right. Heating starts at block 216, where the process starts heaters 158, then moves to block 218 where it sets the I/O controls to position 2 and starts running pump 128.

Blocks 216-220 form a loop in which the process monitors T1 and T3 and adjusts heating accordingly, slowly warming the working fluid until it reaches the required temperature—i.e., when T1 and T3 are no longer too low. At block 220 the process determines whether, having turned on the heater at block 216, T1 and T3 are too low. If at block 220 the process determines that T1 and T3 are both too low, it returns to block 216 where it increases heating by heater 158, continues to block 218 where it continues to run pump 128, then returns to block 220 to check again whether T1 and T3 are too low.

When T1 and T3 have reaches acceptable values, meaning that electronics 106 can be started, the process turns on the electronics and begins a shift to the normal control strategy. If at block 220 the process determines that T1 and T3 are no longer too low it proceeds to block 222, where it starts electronics 106, then proceeds to block 224 where it increases the pump speed of pump 128, circulating more working fluid through the heating loop. The process then proceeds to block 226, where it turns off the heating plate, and then proceeds to block 228 where it checks whether T3 is within the design range. Having started electronics 106 and turned off the heating plate, the system is now self-heating (i.e., heated by electronics 106 themselves).

If at block 228 the process determines that T3 is within the design range, it proceeds to block 230 where it maintains the current pump speed and keeps the I/O controls in position 2—that is, it allows the heating loop to continue providing all temperature control as long as T3 is within design range. But if at block 228 the process determines that T3 is no longer within design range, meaning that the heating loop can no longer control the temperature on its own, the process proceeds to block 232, where it continues running the heating loop with self-heating, and also moves to block 234 where it starts to shift the I/O controls from position 2 to an intermediate position, so that working fluid circulates through both the heating loop and the cooling loop. For instance, the I/O controls might initially shift to a position with 50% flowing in the heating loop and 50% flowing in the cooling loop. With the inlet and outlet controls in an intermediate position, the cooling loop can begin to balance the self-heated heating loop.

At block 236 the process then checks whether T2 is in the working temperature range. If at block 236 T2 is not within the working temperature range the process returns to block 232, where it continues running the heating loop with self-heating, and continues to block 234, where it shifts the I/O controls further toward position 1—i.e., allowing more flow in the cooling loop and less in the heating loop. The process then returns to block 236 to check again whether T2 is in the working temperature range. If at block 236 the process determines that T2 is in the working temperature range, it switches the I/O controls fully to position 1, thus allowing flow only through the cooling loop at block 238, and then continues to block 240, where it invokes its normal temperature control strategy. The process ends at block 242.

Figure 3A:
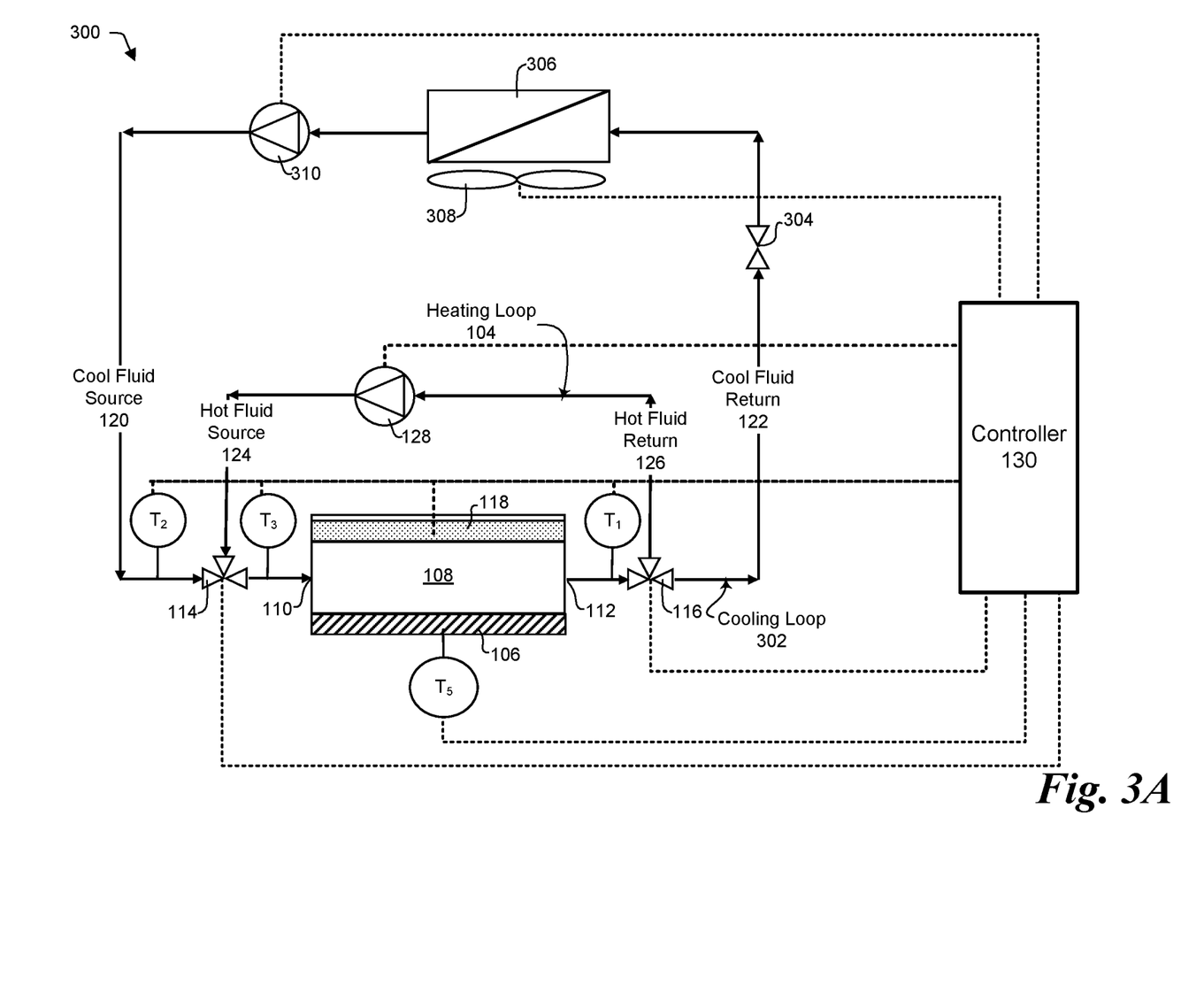
FIGS. 3A-3B are schematics of embodiments of temperature control systems with closed-loop cooling.

FIG. 3A illustrates an embodiment of a temperature control system 300. System 300 is in most respects similar to system 100: the primary difference between systems 300 and 100 is in the cooling loop, which is an open loop in system 100 but a closed loop in system 300.

System 300 includes a temperature control plate 108 thermally coupled to heat-generating electronics 106. Temperature control plate 108 includes a fluid inlet 110 and a fluid outlet 112, with an inlet control 114 fluidly coupled to fluid inlet 110 and an outlet control 116 fluidly coupled to fluid outlet 112. Temperature control plate 108 allows heat provided by the heat-generating electronic components 106 themselves to heat the working fluid flowing through it. Temperature control plate 108 also includes heater 118 to heat the working fluid.

Heating loop 104 is substantially the same in system 300 as it is in system 100: it is a closed loop fluidly coupled to temperature control plate 108. A heating fluid source 124 is fluidly coupled to inlet control 114 and a heating fluid return 126 is fluidly coupled to outlet control 116, so that the inlet and outlet controls regulate the flow of hot working fluid through temperature control plate 108.

Cooling loop 302 in system 300 is different than cooling loop 102 in system 100. In system 300 the cooling loop is a closed loop instead of an open loop. As a result, cooling loop 302 includes additional components not found in cooling loop 102. As in system 100, cool fluid source 120 is coupled to inlet control 114 and cool fluid return 122 is coupled to outlet control 116. Cool fluid return 122 is coupled to a valve 304 and to the inlet of a heat exchanger 306. In one embodiment heat exchanger 306 can be an air-cooled radiator with or without a fan 308 to force convection through the radiator, but in other embodiments it can be another type of heat exchanger. A pump 310 is coupled to the cooling loop at the outlet of heat exchanger 304 to circulate working fluid through the cooling loop. System 300 can include the same temperature sensors T1-T3 and T5 in the same locations as in system 100.

Controller 130 is coupled to several elements to control operation of system 300. In one embodiment, controller 130 can be a general-purpose computer including a processor, memory, storage, a communication interface, and other such components, but in other embodiments it can be a special-purpose circuit such as an application-specific integrated circuit (ASIC). Controller 130 is communicatively coupled to temperature sensors T1-T5 so that it can receive temperature information from the temperature sensor locations. Controller 130 is also communicatively coupled to inlet control 114 and outlet control 116, to heater 118, to fan 308, and to pumps 128 and 310. Controller 130 has instructions stored thereon that, when executed by the controller, allow the controller to monitor the measured temperatures and to control the other components to which it is communicatively coupled so that it controls operation of system 300.

Despite their differences, system 300 and 100 operate similarly and have the same modes of operation. By selectively configuring inlet control 114 and outlet control 116, cool working fluid, hot working fluid, or a mixture of the two, can be directed through temperature control plate 108 to regulate the temperature of electronics 106.

Figure 3B:
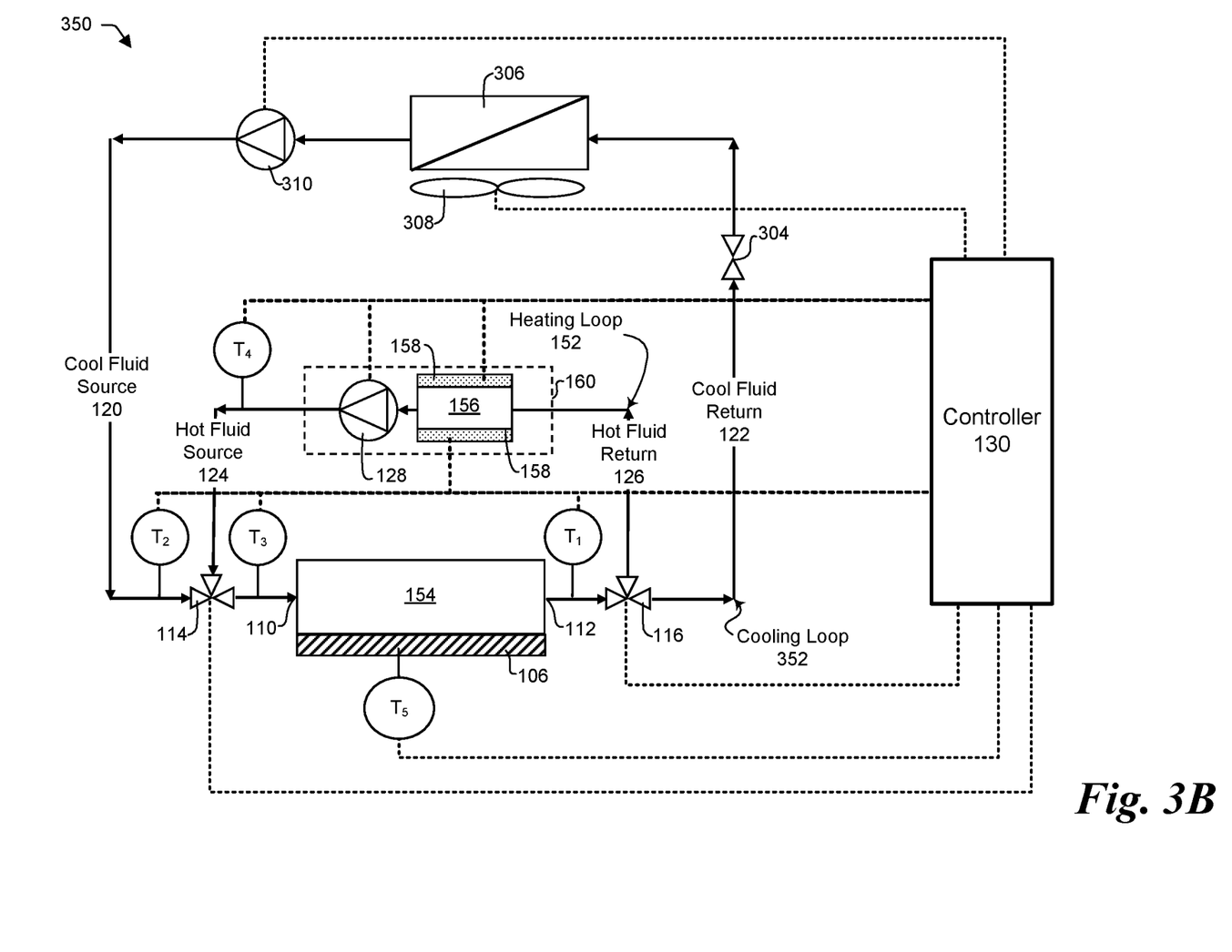

FIG. 3B illustrates another embodiment of a temperature control system 350. System 350 is in most respects similar to system 150: the primary difference between systems 350 and 150 is in the cooling loop.

System 350 includes a cold plate 154 thermally coupled to heat-generating electronics 106. Cold plate 154 includes a fluid inlet 110 and a fluid outlet 112, with an inlet control 114 fluidly coupled to fluid inlet 110 and an outlet control 116 fluidly coupled to outlet 112. Cold plate 154 allows heat provided by the heat-generating electronic components 106 themselves to heat the working fluid flowing through it.

Heating loop 104 is substantially the same in system 350 as it is in system 150: it is a closed loop fluidly coupled to cold plate 154. A heating fluid source 124 is fluidly coupled to inlet control 114 and a heating fluid return 126 is fluidly coupled to outlet control 116, so that the inlet and outlet controls regulate the flow of not working fluid through cold plate 154. A heating plate 156 and pump 128 are fluidly coupled in the heating loop. In one embodiment, heating plate 156 and pump 128 can be combined into a single unit or module 160 that can be easily coupled and uncoupled from the heating loop, and in which a single power source is needed to power the resistor to generate heat and to power the pump motor.

Cooling loop 352 in system 350 is different than cooling loop 102 in system 150. In system 350 the cooling loop is a closed loop instead of an open loop. As a result, cooling loop 352 includes additional components not found in cooling loop 102. As in system 150, cool fluid source 120 is coupled to inlet control 114 and cool fluid return 122 is coupled to outlet control 116. Cool fluid return 122 is coupled to a valve 304 and to the inlet of a heat exchanger 306. In one embodiment heat exchanger 306 can be an air-cooled radiator with or without a fan 308 to force convection through the radiator, but in other embodiments it can be another type of heat exchanger. A pump 310 is coupled to the cooling loop at the outlet of heat exchanger 304 to circulate working fluid through the cooling loop. System 350 can include the same temperature sensors T1-T5 in the same locations as in system 150.

Controller 130 is coupled to several elements to control operation of system 350. In one embodiment, controller 130 can be a general-purpose computer including a processor, memory, storage, a communication interface, and other such components, but in other embodiments it can be a special-purpose circuit such as an application-specific integrated circuit (ASIC). Controller 130 is communicatively coupled to temperature sensors T1-T5 so that it can receive temperature information from the temperature locations to monitor the conditions within system 100. Controller 130 is also communicatively coupled to inlet control 114 and outlet control 116, to heaters 158, to fan 308, and to pumps 128 and 310. Controller 130 has instructions stored thereon that, when executed by the controller, allow the controller to monitor the measured temperatures and to control the other components to which it is communicatively coupled, so that it controls the operation of system 350.

Despite their differences, system 350 and 150 operate similarly and have the same modes of operation. By selectively configuring inlet control 114 and outlet control 116, cool working fluid, hot working fluid, or a mixture of the two, can be directed through cold plate 154 to regulate the temperature of electronics 106. An embodiment of a process for controlling system 350 is described below in connection with FIGS. 4A-4B.

Figure 4A:
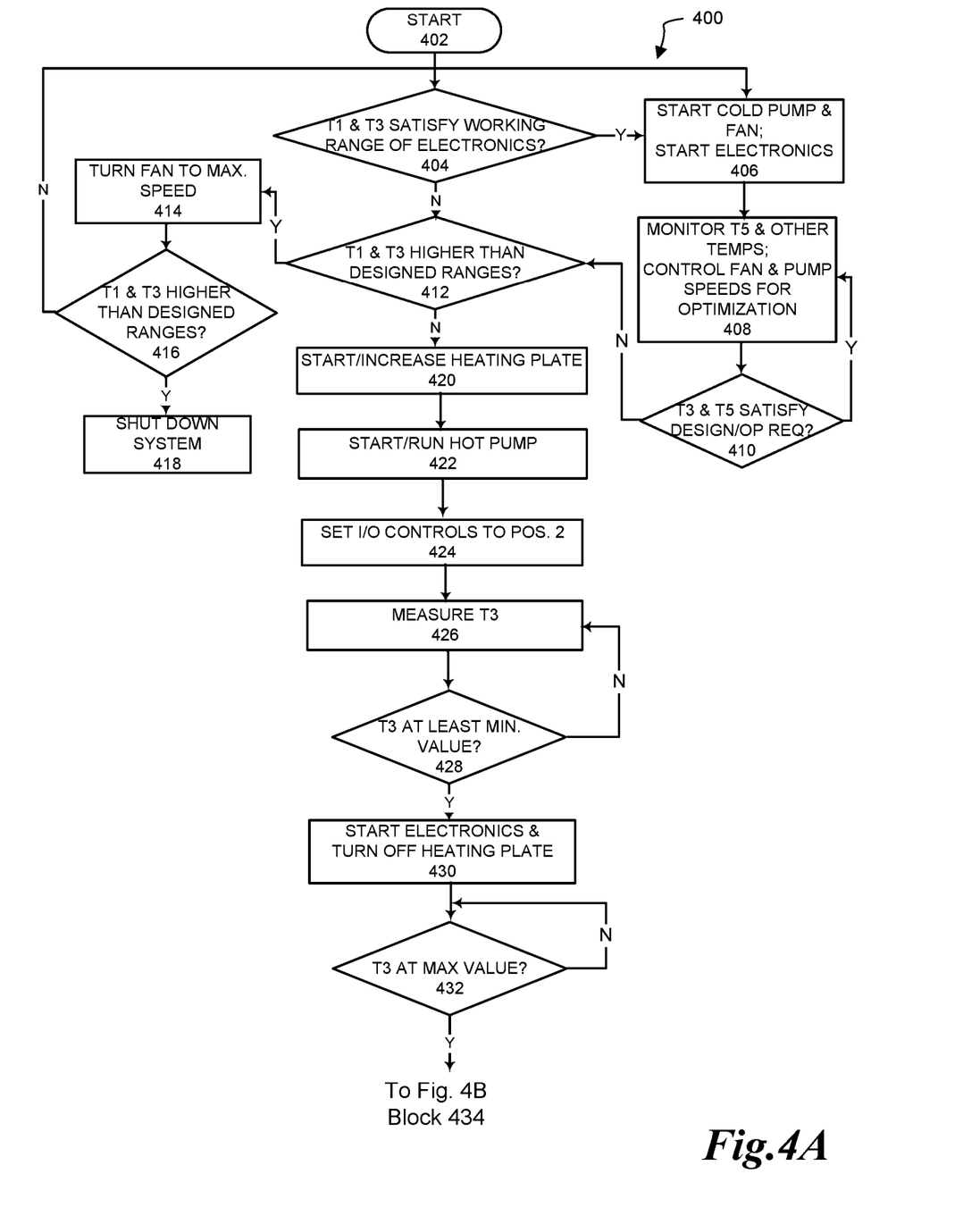
FIGS. 4A-4B together are a flowchart of an embodiment of a process for operating the temperature control system of FIG. 3B.
Figure 4B:
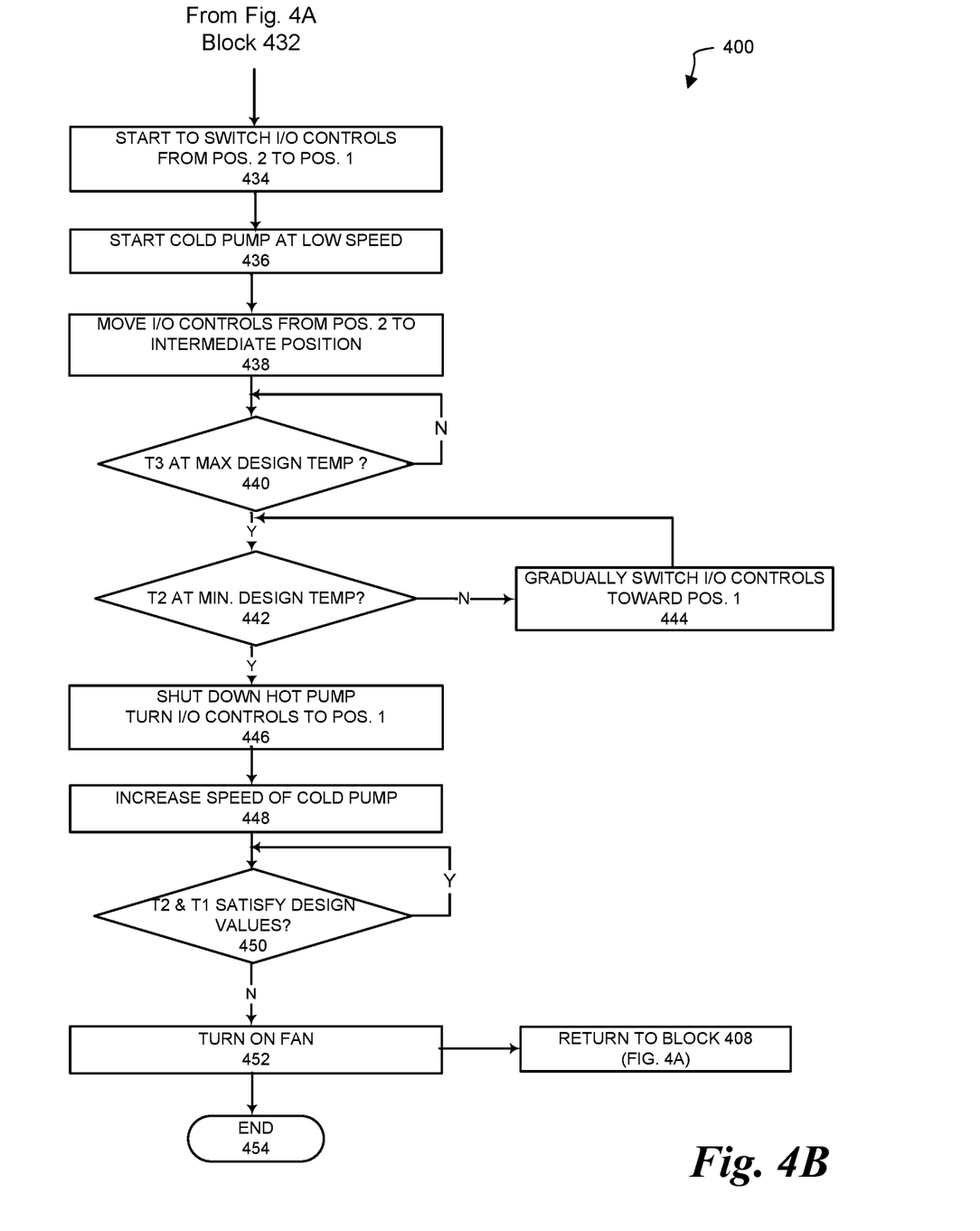

FIGS. 4A-4B together illustrate an embodiment of a process 400 for operating a temperature control system with closed-loop cooling, such as system 350. Although described with reference to system 350, the illustrated process can be extended to other embodiments, such as system 300 (see FIG. 3A). To make the flowchart less cluttered, the following terminology is used in the flowchart and in its description below:

Inlet control 114 and outlet control 116 are referred to—individually or collectively, as the context requires—as I/O controls.

Inlet control 114 has positions 1 and 2, as well as one or more intermediate positions between positions 1 and 2. Position 1 allows flow only through the cooling loop, position 2 allows flow only through the heating loop, and intermediate positions allows flow through both the cooling loop and heating loop. The exact intermediate position regulates how much working fluid flows through each loop.

Outlet control 116 similarly has positions 1 and 2, as well as one or more intermediate positions between positions 1 and 2. Position 1 allows flow only through the cooling loop, position 2 allows flow only through the heating loop, and intermediate positions allows flow through both the cooling loop and heating loop. The exact intermediate position regulates how much working fluid flows through each loop.

Electronics refers to one or more electronic components 106.

Self-heating refers to a condition in which working fluid in the heating loop is heated only by the electronic components 106 themselves.

T1-T5 are used to refer to temperature sensors T1-T5 or to the temperatures measured by those sensors, as the context requires.

"Hot pump" refers to the pump that circulates fluid through the heating loop (pump 128 in the embodiment of FIG. 3B), while "cold pump" refers to the pump that circulates working fluid through the cooling loop (pump 310 in the embodiment of FIG. 3B).

The process begins at block 402. At blocks 404-418 the process first determines whether the system can operate according to its normal operating strategy and, if it can, adjusting the system to operate according to that strategy. In most scenarios, cooling is the normal operating strategy. At block 404 the process checks whether T1 and T3 satisfy the operation and design requirements. If at block 404 T1 and T3 satisfy design and operation requirements, meaning that no heating is required, the process moves to block 406, where it starts the cold pump and electronics 106. The process then continues to block 408, where it monitors T5 and other temperatures as well as controlling the speeds of fan 308 and pump 310 to optimize performance. At block 410, the process monitors whether T3 and T5 continue to satisfy design/operating requirements. If at block 410 T3 and T5 continue to meet the requirement, operation of the system continues according to the normal operation strategy at block 408.

If at block 404 the system determines that T1 and T3 are not within the working range of the electronics, or if at block 410 T3 and T5 do not meet design/operation requirements, the process moves to block 412, where it determines whether T1 and T3 are higher than their design ranges. If at block 412 T1 and T3 are higher than their design ranges, meaning that more cooling is required, the process moves to block 414, where it turns fan 308 to maximum speed, then continues to block 412, where it again determines whether T1 and T3 are higher than their design ranges. If at block 416 T1 and T3 are higher than their design ranges, the system cannot provide adequate cooling and shuts down at block 418. But if at block 416 T1 and T3 are lower than their design ranges, the process moves to blocks 406-410, where it operates according to its normal strategy as described above.

If at block 412 the process determines that T1 and T3 are not higher than their design ranges, that means that the system requires heating and cannot immediately its normal operating strategy. Blocks 420-454 implement a hybrid control strategy in which the process first heats and then returns to its normal operating strategy when conditions are right. At block 420 the process starts or increases heating by heater 158, then it continues to block 422, where it starts to run the hot pump. At block 424 it sets the I/O controls to position 2 and at block 426 it measures T3.

Blocks 426-428 monitor T3 to see if it exceeds a minimum value. At block 428 the process checks whether T3 is at least a minimum value. If at block 428 T3 is not at least a minimum value, the process returns to block 426, again measures T3, and returns to block 428. But if at block 428

T3 equals or exceeds a minimum value, that means the working fluid temperature is high enough to start the electronics. At block 430, the electronics are started (i.e., turned on), and heater 158 is turned off, so that the heating loop is now self-heated by the electronics. Block 432 monitors whether T3 exceeds a maximum value. If at block 432 T3 does not exceed its maximum value, the system keeps operating in its current self-heated state. But if at block 432 T3 does exceed its maximum value, the system moves to block 434 to begin the transition from heating to cooling.

At block 434, the system starts to switch the I/O controls from position 2 to position 1, and at block 436 it starts the cold pump at low speed, so that both the heating loop and cooling loop are self-heating. At block 438 the process continues switching the I/O controls from position 2 to an intermediate position, while at block 440 the process monitors whether T3 has reached the maximum design temperature. If at block 440 T3 has not reached its maximum, the system continues operating in its current state. But if at block 440 T3 has reached its maximum, the system moves to block 442, where it checks whether T2 is at its minimum design temperature.

If at block 442 T2 is not at its minimum design temperature, the self-heating loop is no longer needed and the process moves to block 444, where it gradually switches the I/O controls from position 2 to position 1, thus gradually phasing in the cooling capacity of the cooling loop and a balance of heating and cooling between loops. This gradual switching can happen along a schedule, for instance 50% position 1, 60% position 1, 70% position 1, and so on, to gradually phase out the heating loop and phase in the cooling loop. But if at block 442 T2 is at its minimum design temperature, the process moves to block 446, where it shuts down the hot pump, turns the I/O controls to position 1, then continues to block 448 where it increases the speed of the cold pump, thus increasing the flow of cooling fluid.

At block 450, the process monitors whether T2 and T1 satisfy design values. If at block 450 T2 and T1 satisfy design values, the system operates in its current state. But if at block 450 T2 and T1 do not satisfy their design values, the process moves to block 452, where it turns on fan 308, then returns to its normal control strategy at block 408. The process ends at block 454.

Figure 5A:
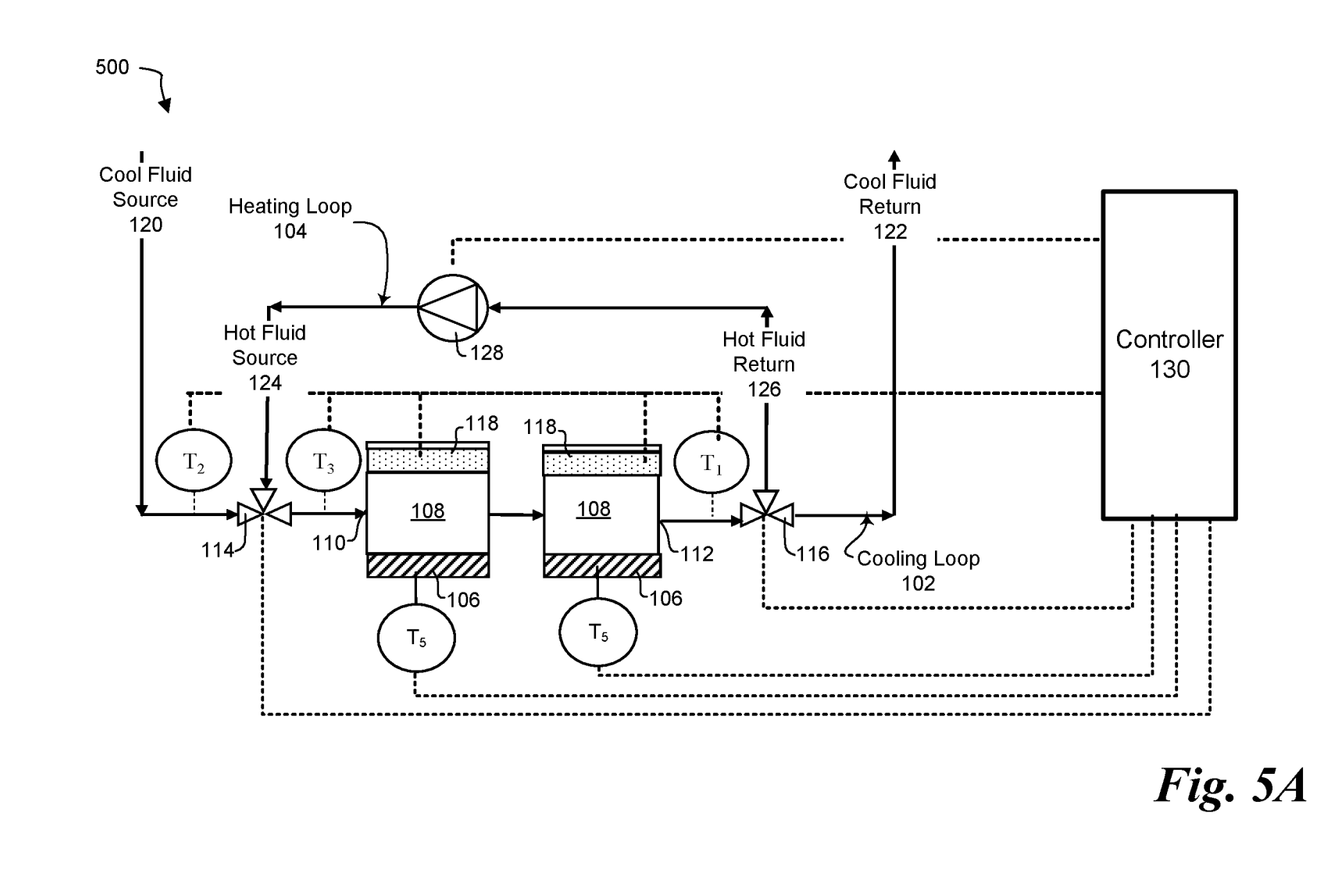
FIGS. 5A-5C are schematics of other embodiments of a temperature control system with open-loop cooling.
Figure 5B:
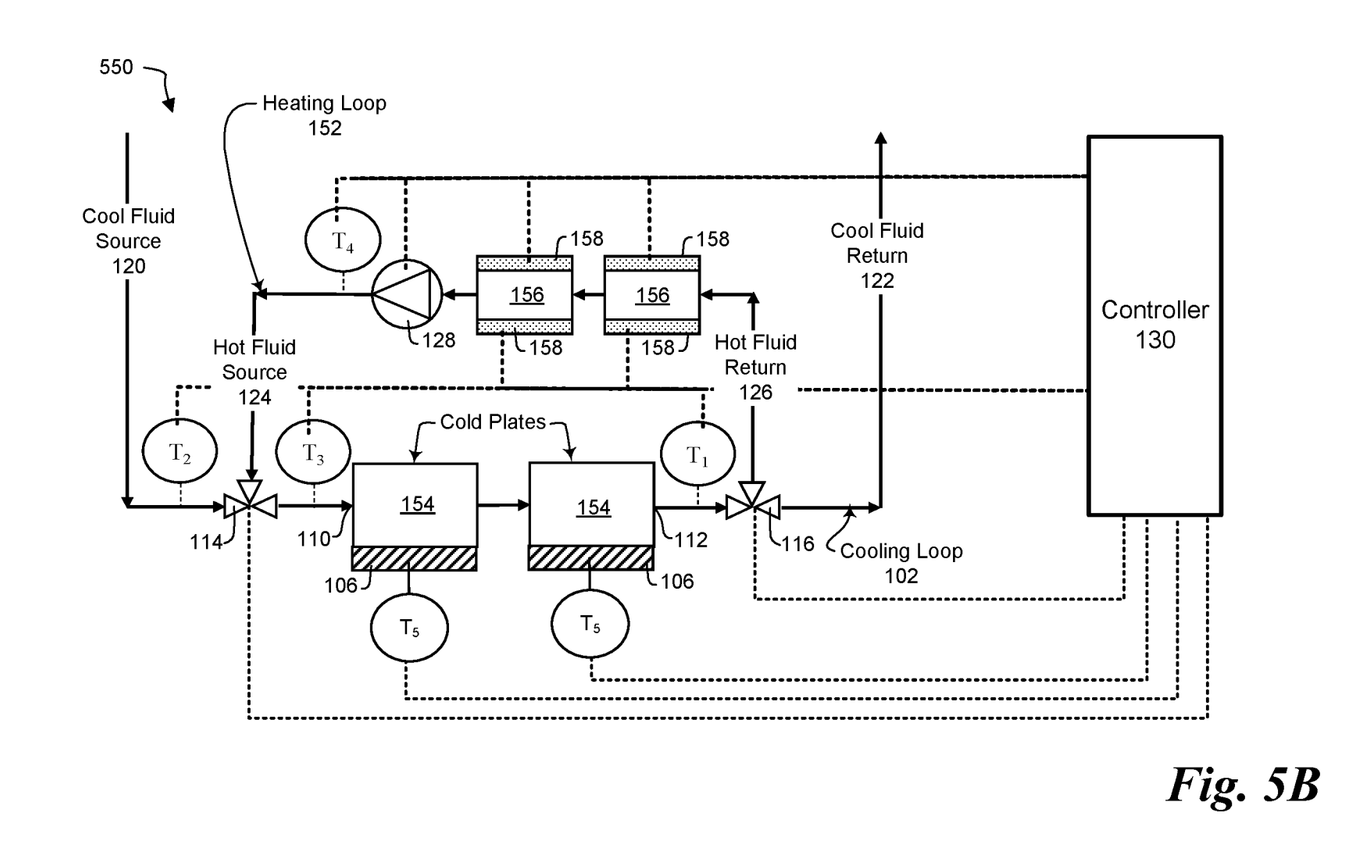
Figure 5C:
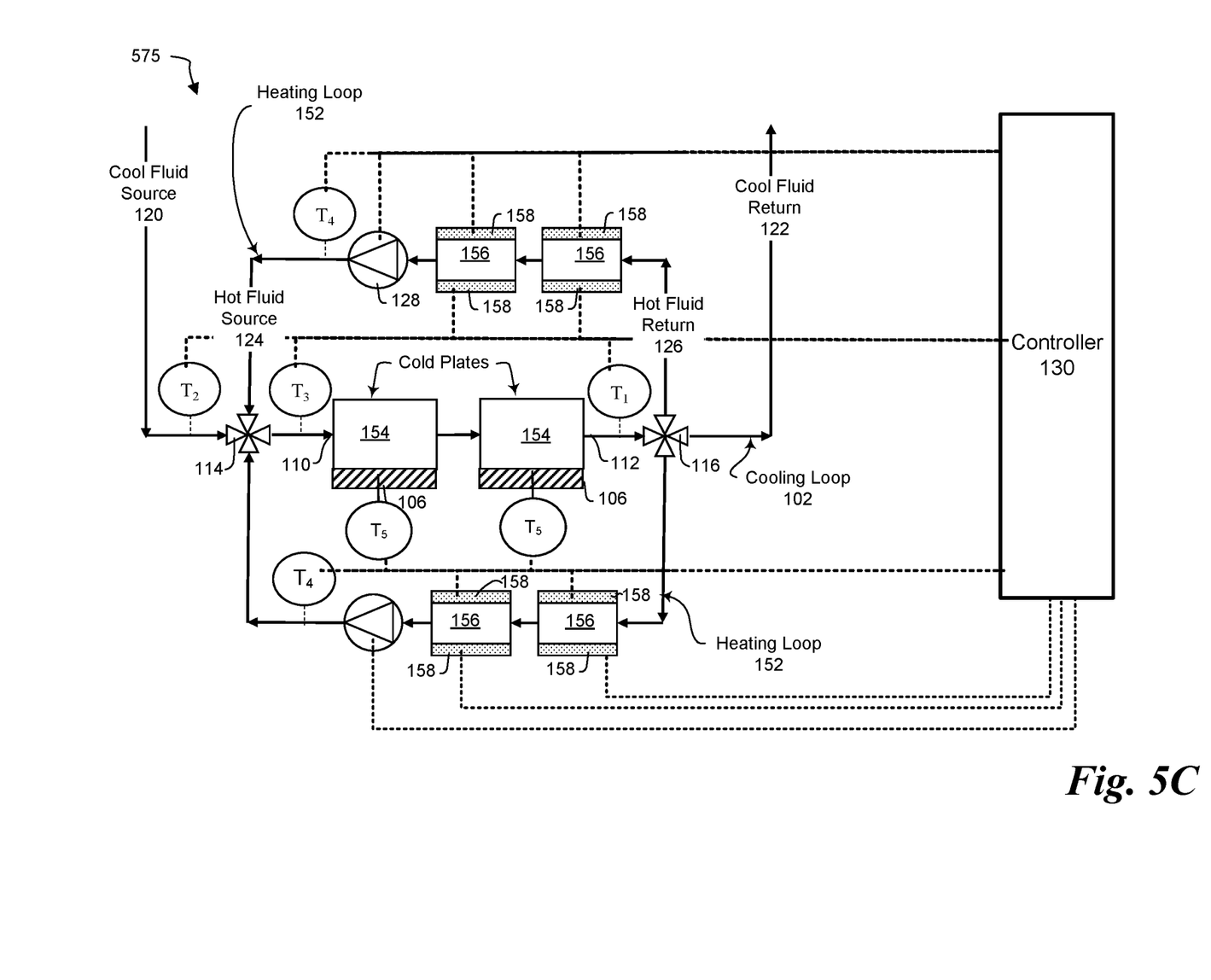

FIGS. 5A-5C illustrate other embodiments of systems 100 and 150 with open-loop cooling, but these embodiments can also be implemented in systems 300 and 350, which have closed cooling loop. The control processes shown in FIGS. 2A-2B can be extended to the illustrated open-loop embodiments, while the control processes shown in FIGS. 4A-4B can be extended to closed-loop versions of the illustrated embodiments.

FIG. 5A illustrates a system 500 that is in most respects similar to system 100. The primary different between systems 500 and 100 is that system 500 includes multiple temperature control plates 108, with corresponding couplings to controller 130, instead of only one. In the illustrated embodiment system 500 includes two identical temperature control plates 108, but in other embodiments it can include more temperature control plates than shown and the temperature control plates need not be identical. The illustrated embodiment also shows each temperature control plate 108 thermally coupled to separate electronic components 106, but in other embodiments multiple temperature control plates 108 can be thermally coupled to the same electronic components 106. A control process such as process 200 (FIGS. 2A-2B) can be adapted to allow controller 130 to control the operation of system 500.

FIG. 5B illustrates a system 550 that is in most respects similar to system 150. The primary different between systems 550 and 150 is that system 500 includes multiple cold plates 154 in cooling loop 102 instead of only one, and also includes multiple heating plates 156 in heating loop 152 instead of only one. As in system 500, the additional components have corresponding couplings to controller 130. In the illustrated embodiment cooling loop 102 includes two identical cold plates 154, but in other embodiments it can have more or less cold plates than shown and the cold plates need not be identical. Similarly, in the illustrated embodiment heating loop 152 includes two identical heating plates 156, but in other embodiments it can include more or less heating plates than shown and the heating plates need not be identical. The illustrated embodiment also shows each cold plate 154 thermally coupled to separate electronic components 106, but in other embodiments multiple cold plates 154 can be thermally coupled to the same electronic components 106. In the illustrated embodiment both heating plates 156 are serviced by a single pump 128, but in other embodiments each heating plate 156 can be serviced by its own pump 128, for instance if there are multiple modules 160 in the loop (see FIG. 3B). A control process such as process 200 (FIGS. 2A-2B) can be adapted to allow controller 130 to control the operation of system 550.

FIG. 5C illustrates a system 575 that is in most respects similar to system 550. The primary different between systems 575 and 550 is that system 575 includes multiple heating loops 152. To accommodate multiple heating loops, in one embodiment inlet control 114 and outlet control 116 can be four-way valves, but in other embodiments the inlet and outlet controls could be something else, such as combinations of valves, and the inlet and outlet controls need not be identical. As in system 550, in system 575 the cooling loop includes multiple cold plates 154 instead of only one, and the heating loop includes multiple heating plates 156 instead of only one. As in systems 500 and 550, the additional components in system 575 have corresponding couplings to controller 130.

In the illustrated embodiment of system 575 the cooling loop includes two identical cold plates 154, but in other embodiments it can have more or less cold plates than shown and the cold plates need not be identical. Similarly, the illustrated embodiment of system 550 each heating loop 152 includes two identical heating plates 156, but in other embodiments each heating loop can include more or less heating plates than shown, the number of heating plates in each loop need not be the same, and the heating plates in each loop need not be identical.

The illustrated embodiment also shows each cold plate 154 thermally coupled to separate electronic components 106, but in other embodiments multiple cold plates 154 can be thermally coupled to the same electronic components 106. In the illustrated embodiment both heating plates 156 are serviced by a single pump 128, but in other embodiments each heating plate 156 can be serviced by its own pump 128, for instance if there are multiple modules 160 in the loop (see FIG. 3B). A control process such as process 200 (FIGS. 2A-2B) can be adapted to allow controller 130 to control the operation of system 575.

Other cooling system embodiments of are possible besides the ones described above. For instance:
  The solution can be expanded for heat transfer system with multiple heating loops and/or cooling loops.
  Design can be used for multiple heat transfer loops and sub cooling or/and heating loops.

ML algorithm can be used for adjusting the system to an optimal operating efficiency while satisfying the system design requirement.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
   a cooling loop to circulate a working fluid, including:
   at least one temperature control plate having a fluid inlet and a fluid outlet thermally coupled to one or more heat-generating electronic components, and
   an inlet control and an outlet control fluidly coupled to the fluid inlet and the fluid outlet of the at least one temperature control plate respectively, wherein the inlet control is further coupled to a cooling fluid source;
   a heating loop to circulate the working fluid, the heating loop including:
   a heating fluid source fluidly coupled the inlet control and a heating fluid return fluidly coupled to the outlet control, and
   a pump to circulate heating fluid through at least the heating fluid source, the temperature control plate, and the heating fluid return; and
   a controller communicatively coupled to the inlet control, the outlet control, and the pump, wherein the controller is configured to:
   obtain an initial temperature measured at least at the fluid inlet, the fluid outlet, and the cooling fluid source, and
   execute, based on the initial temperature, a cooling strategy or a hybrid temperature control strategy that includes heating, cooling, and a transition from heating to cooling via at least one of the cooling loop or the heating loop.

2. The apparatus of claim 1 wherein in the cooling strategy, the controller is further configured to:
   start the heat-generating electronic components; and
   set the inlet control and the outlet control to only allow flow of the working fluid through the cooling loop.

3. The apparatus of claim 2 wherein in the cooling strategy, the controller is further configured to:
   monitor a fluid inlet temperature and a fluid outlet temperature; and
   if the fluid inlet temperature or the fluid outlet temperature exceed a predetermined limit, increase a flow rate of the working fluid through the cooling loop.

4. The apparatus of claim 1 wherein:
   the temperature control plate includes a heater to heat fluid circulating through the temperature control plate; or
   the temperature control plate is a cooling plate and the heating loop further includes at least one heating plate separate from the cooling plate, the heating plate including a heater to heat the working fluid circulating through the heating loop.

5. The apparatus of claim 4 wherein in the hybrid temperature control strategy, the controller is further configured to:
   set the inlet control and the outlet control to only allow flow of the working fluid through the heating loop;
   start the heater and the pump; and
   monitor a fluid inlet temperature and a fluid outlet temperature.

6. The apparatus of claim 5 wherein in the hybrid temperature control strategy, the controller is further configured to start the heat-generating electronics and increase a pump speed when the fluid inlet temperature or the fluid outlet temperature exceeds a predetermined limit.

7. The apparatus of claim 6 wherein the controller is further configured to:
   turn off the heater, so that the heating loop is self-heating; and
   if the fluid inlet temperature is within a design range, continue self-heating and maintain a current pump speed and inlet control and outlet control settings.

8. The apparatus of claim 7 wherein in the hybrid temperature control strategy, the controller is further configured to:
   if the fluid inlet temperature is not within the design range, continue self-heating, maintain the current pump speed, and start to switch the inlet control and outlet control toward an intermediate setting that allows flow of the working fluid through both the cooling loop and the heating loop so that the cooling loop can begin to balance the self-heated heating loop.

9. The apparatus of claim 1 wherein in the hybrid temperature control strategy, the controller is further configured to:
   if a temperature of the cooling fluid source is not within a working temperature range, continue to switch the inlet and outlet controls toward an intermediate setting that increases flow of working fluid through the cooling loop and decreases flow of working fluid through the heating loop; and
   if the temperature of the cooling fluid source is within the working temperature range, switch the inlet control and outlet control to settings that only allow flow of working fluid through the cooling loop.

10. An apparatus comprising:
    a cooling loop to circulate a working fluid, the cooling loop including:
    at least one temperature control plate having a fluid inlet and a fluid outlet thermally coupled to one or more heat-generating electronic components,
    an inlet control and an outlet control fluidly coupled to the fluid inlet and the fluid outlet of the at least one temperature control plate respectively,
    a cooling fluid source fluidly coupled the inlet control and a cooling fluid return fluidly coupled to the outlet control,
    a heat exchanger fluidly coupled between the cooling fluid source and the cooling fluid return, wherein the heat exchanger extracts heat from the working fluid received from the cooling fluid return and directs the working fluid into the cooling fluid source,
    a fan to force convection through the heat exchanger, and
    a cooling pump coupled in the cooling loop to circulate the working fluid through the cooling loop;
    a heating loop to circulate the working fluid, the and the heating loop including:
    a heating fluid source fluidly coupled the inlet control and a heating fluid return fluidly coupled to the outlet control, and
    a heating pump to circulate heating fluid through at least the heating fluid source, the temperature control plate, and the heating fluid return; and a controller configured to:
  obtain an initial temperature measured from at least one of the inlet control, the outlet control, the fan, the heating pump, or the cooling pump, and
  execute, based on the initial temperature, a cooling strategy or a hybrid temperature control strategy that includes heating, cooling, and a transition from heating to cooling.

11. The apparatus of claim 10 wherein in the cooling strategy, the controller is further configured to:
  start the heat-generating electronic components;
  start the cooling pump and the fan; and
  set the inlet control and the outlet control to only allow flow of working fluid through the cooling loop.

12. The apparatus of claim 11 wherein in the cooling strategy, the controller is further to control the cooling pump and the fan to optimize cooling performance.

13. The apparatus of claim 12 wherein in the cooling strategy, the controller is further to:
  monitor at least a fluid inlet temperature, a fluid outlet temperature, and an electronics temperature; and
  if the electronics temperature or the fluid inlet temperature exceed a predetermined limit:
    turn the fan to its maximum speed if the fluid inlet temperature or the fluid outlet temperature exceed their design ranges, and
    shut down the apparatus if the fluid inlet temperature and the fluid outlet temperature do not decrease into their design ranges.

14. The apparatus of claim 10 wherein:
  the temperature control plate includes a heater to heat fluid circulating through the temperature control plate; or
  the temperature control plate is a cooling plate and the heating loop further includes at least one heating plate separate from the cooling plate, the heating plate including a heater to heat the working fluid circulating through the heating loop.

15. The apparatus of claim 14 wherein in the hybrid temperature control strategy, the controller is further to:
  set the inlet control and the outlet control to only allow flow of working fluid through the heating loop;
  start the heater and the heating pump;
  monitor the fluid inlet temperature.

16. The apparatus of claim 15 wherein in the hybrid temperature control strategy, the controller is further to start the heat-generating electronics and turn off the heater, so that with the heater off and the heat-generating electronics on the heating loop is self-heating, when the fluid inlet temperature exceeds a minimum value.

17. The apparatus of claim 16 wherein in the hybrid temperature control strategy, the controller is further to, when the fluid inlet temperature exceeds a maximum value:
  start the cooling pump at a low speed;
  start to switch the inlet and outlet controls toward an intermediate setting that allows flow through both the cooling loop and the heating loop; and
  maintain a current pump speed and inlet and outlet control settings until the fluid inlet temperature drops below its maximum design value.

18. The apparatus of claim 17 wherein when the inlet and outlet controls are in an intermediate setting both the heating loop and the cooling loop are self-heating.

19. The apparatus of claim 17 wherein in the hybrid temperature control strategy, the controller is further to:
  monitor a temperature of the cooling fluid source; and
  if the cooling fluid source temperature is at its minimum design value, continue to switch the inlet and outlet controls toward an intermediate setting that increases flow of the working fluid through the cooling loop and decreases flow of the working fluid through the heating loop until the cooling fluid source temperature exceeds its minimum design temperature.

20. The apparatus of claim 19 wherein in the hybrid temperature control strategy, the controller is further to:
  shut down the heating pump;
  set the inlet control and outlet control to only circulate the working fluid through the cooling loop;
  increase the speed of the cooling pump;
  monitor the cooling fluid source temperature and the fluid outlet temperature; and
  turn on the fan if the cooling fluid source temperature or the fluid outlet temperature exceed their design ranges.

* * * * *